April 18, 1961 P. EGGERS 2,980,828

DIODE SPIDER ASSEMBLY

Filed April 27, 1960

INVENTOR
Preben Eggers

BY W. O. Quesenberry
Claude Funkhouser
ATTORNEYS

United States Patent Office 2,980,828

Patented Apr. 18, 1961

2,980,828

DIODE SPIDER ASSEMBLY

Preben Eggers, West Newton, Mass., assignor, by mesne assignments, to the United States of America as represented by the Secretary of the Navy Filed Apr. 27, 1960, Ser. No. 25,172

5 Claims. (Cl. 317—234)

The present invention relates to high voltage electronic rectifier networks and more particularly to new and improved packaging arrangements for such networks.

Those concerned with the development of high voltage or high current capacity electronic rectifier networks have long recognized the need for such networks in compact packaging arrangements for use in electronic equipment where available space is minimal.

Some of the most critical problems confronting designers of such rectifier networks, in addition to minimal space considerations, have been lack of easy accessibility of rectifier components for repair or replacement and frequent diode breakdown due to inadequate thermal dissipation for such units.

The general purpose of this invention, therefore, is to provide an electronic rectifier network of high voltage and/or high current capacity capabilities which embraces substantially all of the advantages of similarly employed electronic rectifier networks yet possesses none of the aforedescribed disadvantages.

To attain the latter, the instant invention contemplates a unique packaging or spacing arrangement for a plurality of electrically connected diode rectifiers, said arrangement proving to be extremely compact yet maintaining sufficient peripheral surface exposure of each diode for adequate thermal dissipation and simultaneously providing a preferred diode orientation wherein ease of accessibility of diode electrical terminals for connection thereto or repair is enhanced.

An object of the present invention is the provision of a new and improved electronic voltage rectifier network.

Another object is to provide a new and improved compact packaging arrangement for an electronic voltage rectifier network.

A further object of the instant invention is to provide a new and improved electronic voltage rectifier network which is compactly arranged and which provides for adequate thermal dissipation and accessibility of components or parts thereof.

Still another object is to provide a new and improved compactly arranged electrical voltage rectifier network which has the capability of withstanding high voltages.

Yet another object of the instant invention is the provision of a new and improved compactly arranged electronic voltage rectifier having high current capacity capabilities.

A still further object is to provide a new and improved compactly arranged electronic voltage rectifier having both high voltage and high current capacity capabilities.

Other objects and many of the attendant advantages of this invention will be readily appreciated as the same becomes better understood by reference to the following detailed description when considered in connection with the accompanying drawings wherein.

Figure 1:
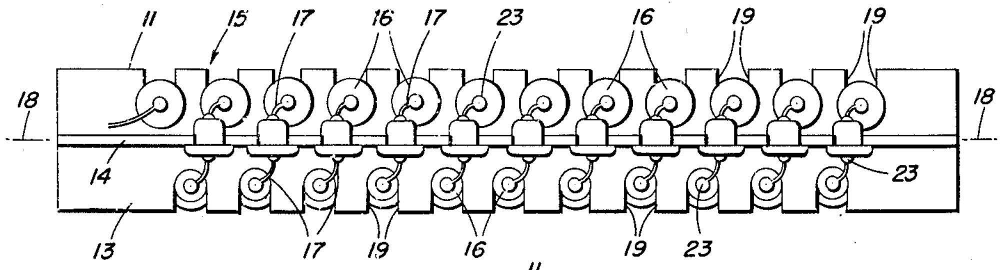
Fig. 1 is a front elevation view of a diode rectifier network packaging arrangement in accordance with one embodiment of the invention.
Figure 2:
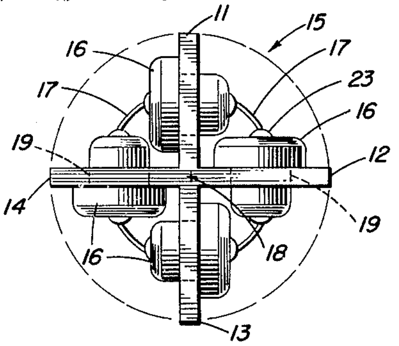
Fig. 2 illustrates an enlarged right side elevational view of the diode rectifier arrangement shown in Fig. 1.

Referring now to the drawings, wherein like reference characters designate like or corresponding parts throughout the several views, there is shown in Fig. 1, which illustrates one embodiment of the invention, a diode spider assembly comprising a plurality of diodes 16 maintained in compact spaced relationship by means of a supporting structure 15. The latter supporting structure 15 is shown in Fig. 1 and Fig. 2, which is a side elevation view of the embodiment illustrated in Fig. 1, to comprise a plurality of radial flange platforms 11, 12, 13 and 14, the latter flange platforms radiating from a common cylindrical or longitudinal axis 18. In the embodiment shown, the flange platforms 11, 12, 13 and 14 intersect at the common axis 18 at right angles to each next adjacent flange platform to produce the cruciform cross section depicted in Fig. 2. Although the illustrated embodiments of the invention show the radial flange platforms to be only four in number, it will be apparent to those of ordinary skill in the art that any number of radial platforms may be utilized without departing from the spirit and scope of the invention. The supporting structure 15 is generally molded or formed of a plastic or resin dielectric or the like but may be suitably constructed, for purposes of this invention, of any suitable structural material.

The longitudinal peripheral edges, parallel to axis 18, of platforms 11, 12, 13 and 14 are notched or slotted along their respective peripheries to provide a plurality of slots 19 for receiving and supporting a plurality of diodes 16, which are shown for purposes of illustration to be semiconductor devices of circular cross section but which may be any type of rectifier and assume any desired cross sectional configuration. The positions of the slots 19 in the periphery of each of the flange platforms 11, 12, 13 and 14 are staggered with respect to the slot positions in each next adjacent platform, the slot positions being located so that, upon subsequent installation of a diode 16 in each of the slots 19, the locus of slot and diode positions proceeding either clockwise or counter-clockwise from one flange platform to the next adjacent flange platform, is always a helix. The advantages of the latter helical spacing arrangement will be apparent from the following description.

Fig. 2 of the drawings illustrates the profound compactness obtainable by arranging the diodes 16 in a ring orientation. The latter ring orientation, though providing an adequate degree of compactness suffers in actual practice from the disadvantage that the electrical terminals 23 of adjacent rectifier diodes 16 are positioned too close to one another and thereby render the making or breaking of electrical connections to either of these terminals 23 difficult. Although it would be possible to increase the spacing between adjacent terminals 23 by increasing the spacing of the diode positions from the axis 18, such a measure would simultaneously defeat the feature of compactness for which the ring formation is initially chosen. A further disadvantage of the ring formation is that adjacent components in the same ring physically overlap to a considerable degree with the resultant deleterious effects of reduced ease of accessibility of the diodes 16 for ease of repair or replacement and inadequacy of thermal dissipation with subsequent overheating and eventual diode breakdown.

Overcoming the latter disadvantages of the ring formation has been an urgent need essential to our national defense in view of the diversity of vital electronic equipment now in use requiring extensive rectifier networks. The problem is magnified when the network must maintain extremely stringent limitations as to available space and provisions must be made for adequate thermal dissipation as well as rapid and easy accessibility for servicing.

The helical spacing and packaging arrangement of the instant invention clearly retains all of the advantages of the ring formation regarding compactness and yet obviates the aforedescribed disadvantages thereof. It will be noted from Fig. 1 that the staggering of slots 19 to produce a helical locus increases the lateral spacing between the electrical terminals 23 of adjacent diodes 16 without affecting the radial width of the assembly and thereby maintains the same degree of compactness as the ring formation. Since the helical arrangement is to be utilized for a great plurality of diodes 16, which may in practice be as many as 40 or more, the increase in axial length due to the staggering of slots 19 as compared with the same number of diodes arranged in a line of parallel rings, proves in practice to be virtually nil.

Again referring to Fig. 1, it will be noted that the helical spider assembly described also reduces the amount of physical overlapping of adjacent diodes 16 and thereby not only improves the ease of accessibility of each diode for repair, replacement or connection thereto but also provides improved thermal dissipation since the surface area of each diode can more readily surrender heat to a suitable cooling medium.

The provision of the rectifier network packaging arrangement of the instant invention enables the construction of electronic equipment previously incapable of realization because of the requirement for rectifier networks of size and dependability heretofore unobtainable by the prior art.

Figure 3:
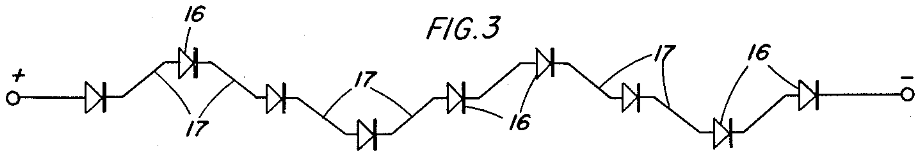
Fig. 3 is an electrical circuit diagram illustrating one manner in which the diodes of the physical arrangement shown in Figs. 1 and 2 may be electrically interconnected.

The compact rectifier arrangement resulting from the present invention may be electrically interconnected in a variety of ways. The embodiment shown in Figs. 1 and 2 and illustrated in the circuit diagram of Fig. 3 utilizes all of the diodes 16 electrically connected in series by means of leads 17. In this way compact and thermally stable high voltage rectifiers, even of the order of 10,000 volts or more, are obtainable by connecting a plurality of small diodes 16, having much lower voltage capabilities, in series.

Figure 4:
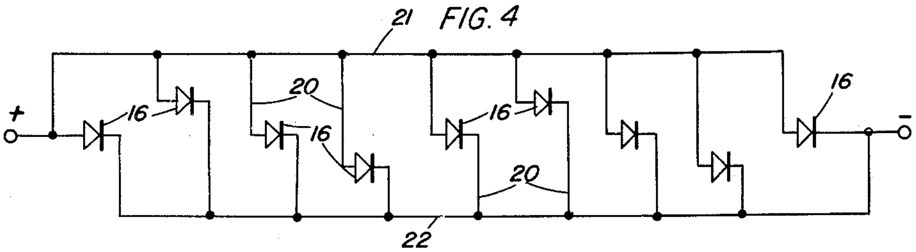
Figs. 4 and 5 illustrate further examples of the ways in which the diodes of the arrangement shown in Figs. 1 and 2 may be electrically interconnected.

Fig. 4 illustrates an alternative manner of utilizing the helical diode spider assembly of Fig. 1 and shows each of the diodes 16 electrically connected in parallel via leads 20 to common leads or busses 21 and 22. The current capacity of such an arrangement is equal to the sum of the current capacities of each of the diodes 16.

Figure 5:
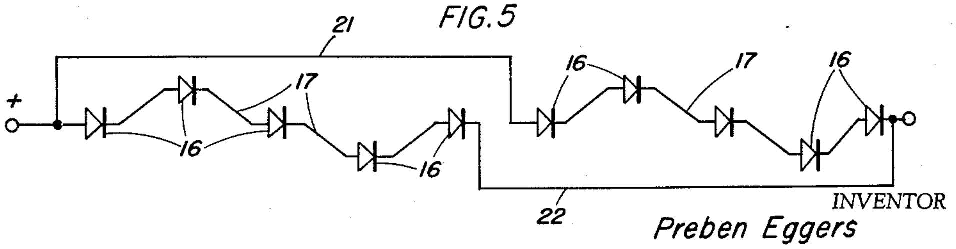

Fig. 5 is illustrative of a still further circuit arrangement of the diode spider assembly of Fig. 1 and shows two banks of diodes 16 wherein the diodes of each bank are electrically connected in series via leads 17 and the two series banks are thereafter connected in parallel via leads 21 and 22. The latter circuit configuration produces a rectifier network having both high voltage and high current capacity capabilities, the voltage capability being determined by the number of diodes 16 in series in each bank, whereas the current capacity is determined by the total number of banks in parallel.

As previously pointed out, the number of radial flange platforms may be varied at will and, although in practice three or more flange platforms have been utilized with success, the cruciform four flange support illustrated in Figs. 1 and 2 has been found to produce a desirable compromise between radial width, the latter dimension increasing as the number of flanges are increased, and reasonable axial length. The resultant device, with all of the diodes 16 properly secured in position provides a unique rectifier network assembly readily insertable in the oil dielectric or heat transfer mediums of electronic equipment.

Obviously, many modifications and variations of the present invention are possible in the light of the above teachings. It is therefore to be understood that within the scope of the appended claims, the invention may be practiced otherwise than as specifically described.

What is claimed is:

1. A compact voltage rectifier for use in electronic equipment having stringent economy of space, thermal dissipation and ease of accessibility for service requirements comprising a plurality of diodes, means to electrically interconnect said diodes, supporting means to support said diodes, said supporting means including a plurality of radial flange platforms radiating from a common cylindrical axis, the longitudinal peripheral edges of said flange platforms having a plurality of slots therein to receive and support said diodes, said slots being spaced such that the locus of slot positions proceeding from one flange platform to the next adjacent flange platform is a helix, whereby diodes inserted in said notches will be positioned such that their electrical terminals are easily accessible for connection thereto and sufficient surface area of each of said diodes will be exposed for adequate thermal dissipation.

2. The voltage rectifier of claim 1 wherein the number of radial flange platforms is greater than two.

3. A compact high voltage rectifier for use in electronic equipment having stringent requirements as to available space, adequate thermal dissipation and ease of accessibility for servicing comprising a plurality of cylindrical diodes, means to electrically connect all of said diodes in series, supporting means for said diodes, said supporting means including four radial flange platforms intersecting at a common cylindrical axis and having a cruciform cross section, the longitudinal peripheral edges of said flange platforms having a plurality of slots therein, one of said diodes being supported in each of said slots, said slots being spaced such that the locus of diode positions proceeding from one flange platform to the next adjacent flange platform is a helix, whereby the electrical terminals of each of said diodes are easily accessible for electrical connection thereto and sufficient surface area of each diode is exposed for adequate thermal dissipation.

4. A packaging device for supporting and spacing electronic components in equipment having stringent requirements as to available space, adequate thermal dissipation and ease of accessibility for servicing comprising a plurality of radial flange platforms radiating from a common cylindrical axis, the longitudinal peripheral edges of said flange platforms having slots therein adapted to receive and support electronic components in each of said slots, said slots being spaced such that the locus of slot positions proceeding from one flange platform to the next adjacent flange platform is a helix.

5. The packaging device of claim 4 wherein the number of radial flange platforms is greater than two.

References Cited in the file of this patent

UNITED STATES PATENTS 2,430,904 Boldingh -------------- Nov. 18, 1947